(12) United States Patent
Wilm et al.

(10) Patent No.: US 10,379,190 B2
(45) Date of Patent: Aug. 13, 2019

(54) METHOD OF DETERMINING A GRADIENT IMPULSE RESPONSE FUNCTION DURING EXECUTION OF A MAGNETIC RESONANCE IMAGING OR SPECTROSCOPY SEQUENCE (71) Applicants: EIDGENOSSISCHE TECHNISCHE HOCHSCHULE, Zurich (CH); UNIVERSITAT ZURICH, Zurich (CH)

(72) Inventors: Bertram Wilm, Zurich (CH); Christoph Barmet, Zurich (CH); Klaas P. Prussmann, Zurich (CH)

(73) Assignee: Eidgenossische Technische Hochschule (ETH) ETH Zentrum, Zurich (CH)

( * ) Notice: Subject to any disclaimer, the term of this patent is extended or adjusted under 35 U.S.C. 154(b) by 86 days.

(21) Appl. No.: 15/573,284

(22) PCT Filed: May 12, 2016

(86) PCT No.: PCT/EP2016/060740
§ 371 (c)(1),
(2) Date: Nov. 10, 2017

(87) PCT Pub. No.: WO2016/180938
PCT Pub. Date: Nov. 17, 2016

(65) Prior Publication Data
US 2018/0136298 A1     May 17, 2018

(30) Foreign Application Priority Data
May 12, 2015 (EP) .................................. 15167449

(51) Int. Cl.
*G01R 33/565* (2006.01)
*G01R 33/389* (2006.01)
(Continued)

(52) U.S. Cl.
CPC ..... *G01R 33/56518* (2013.01); *G01R 33/389* (2013.01); *G01R 33/4625* (2013.01); *G01R 33/58* (2013.01)

(58) Field of Classification Search
CPC ............ G01R 33/56518; G01R 33/389; G01R 33/58; G01R 33/4625
(Continued)

(56) References Cited

U.S. PATENT DOCUMENTS 9,791,526 B2 * 10/2017 Barmet .................. G01R 33/24

FOREIGN PATENT DOCUMENTS

WO    2012/143574 A1    10/2012

OTHER PUBLICATIONS

Graedel, Nadine N. et al., Image reconstruction using the gradient impulse response for trajectory prediction, Proceedings of the Intl. Society for Magentic Resonance in Medicine, ISMRM 21st Scientific Meeting and Exhibition, 2013, 552.
(Continued)

*Primary Examiner* — Reena Aurora
(74) *Attorney, Agent, or Firm* — Barrett McNagny LLP; George Pappas (57) ABSTRACT

A method of determining an actual gradient impulse response function during execution of a magnetic resonance (MR) imaging or spectroscopy sequence, wherein a main magnetic field is generated in a sample region of an MR apparatus by means of a main magnet and wherein superimposed time dependent gradient fields and radiofrequency fields in a first RF band are generated in the sample region according to a first MR sequence for forming images or spectra, the gradient fields being generated by gradient forming means of the MR apparatus operated according to a gradient forming sequence part of said first MR sequence, the MR apparatus further comprising at least one magnetic field probe. The method comprises the steps of: —operating said at least one magnetic field probe according to a second sequence, whereby a time dependent probe signal is repeatedly acquired from each magnetic field probe during a probe acquisition time window, thus providing at least one time dependent probe signal; —obtaining said actual gradient impulse response function by calculating an impulse response function from said at least one time dependent probe signal and from said gradient forming sequence part.

20 Claims, 10 Drawing Sheets (51) Int. Cl.
*G01R 33/58* (2006.01)
*G01R 33/46* (2006.01)

(58) Field of Classification Search
USPC .......................................................... 324/309
See application file for complete search history.

(56) References Cited

OTHER PUBLICATIONS

Dietrick, B.E., et al., An Autonomous System for Continuous Field Monitoring with Interleaved Probe Sets, Proceeding of the International Society for Magentic Resonance in Medicine, ISMRM 19th Scientific Meeting and Exhibition, 2011, 1842.

Barmet, C., et al., Concurrent higher-order field monitoring for routine head MRI: an integrated heteronuclear setup; Proceedings of the International Society for Magentic Resonance in Medicine, ISMRM, 18th Scientific Meeting and Exhibition, Stockholm, Sweden 2010, 216.

Vannesjo, S.Johanna, et al., Field Camera Measurements of Gradient and Shim Impulse Responses Using Frequency Sweeps, Magnetic Resonance in Medicine 2014, 72: 570-583.

Vannesjo, S.J., et al., Gradient System Characterization by Impulse Response Measurements with a Dynamic Field Camera, Magnetic Resonance in Medicine 2013; 69: 583-593.

Barmet, Christopher et al., Spatiotemporal Magnetic Field Monitoring for MR, Magnetic Resonance in Medicine 2008, 60(1): 187-197.

\* cited by examiner

METHOD OF DETERMINING A GRADIENT IMPULSE RESPONSE FUNCTION DURING EXECUTION OF A MAGNETIC RESONANCE IMAGING OR SPECTROSCOPY SEQUENCE

This application claims priority from PCT application No. PCT/EP2016/060740 filed May 12, 2016 which claims priory from European application No. EP 15167449.6 filed on May 12, 2015, the disclosures of which are incorporated herein by reference.

FIELD OF THE INVENTION

The present invention generally relates to a method of determining an actual gradient impulse response function ("GIRF") during execution of a magnetic resonance imaging or spectroscopy sequence. This method will also be called "gradient response harvesting".

BACKGROUND OF THE INVENTION

Time-varying magnetic field gradients are essential for signal preparation and encoding in magnetic resonance imaging and spectroscopy. Most MR methods rely on highly accurate gradient time-courses for correct signal encoding and suffer from artifacts when significant deviations from the prescribed time-courses occur. In practice, effective gradient waveforms usually do differ somewhat from the ideal shapes defined in the underlying pulse sequence. These deviations are largely due to a variety of hardware imperfections including bandwidth limitations of gradient amplifiers, eddy currents induced in gradient coils and in other conducting structures of the scanner, field fluctuations caused by mechanical vibrations after gradient switching, and thermal variation in hardware components. Slight perturbations can also stem from physiologically induced fields that originate in the subject under examination or from magnetic sources and currents external to the MR system. Besides further hardware optimization, the most common ways of addressing dynamic field imperfections are precompensation of gradient waveforms and postcorrection of acquired data. Both of these options are most feasible for mechanisms of perturbation that are reproducible and can be accurately modeled (see Vannesjö S J et al., Gradient system characterization by impulse response measurements with a dynamic field camera. Magn Reson Med 2013; 69: 583-589, and references cited therein).

According to linear systems theory, the above mentioned approach should permit jointly representing all the response mechanisms that are linear and time-invariant (LTI). A net gradient impulse response function (GIRF) should hence incorporate influences on the gradient waveform between the console and the magnet bore. This would include amplifier and coil characteristics as well as eddy currents and vibration-induced fields, without the need to consider individual underlying mechanisms. Knowledge of the comprehensive GIRF could form the basis of advanced pre-emphasis and serve for quality assurance purposes. It could also yield more accurate estimates of effective k-space trajectories for image reconstruction and of other encoding parameters such as b-values in diffusion imaging or gradient moments in velocity mapping. The key challenge toward this goal is determining GIRFs accurately, with sufficient bandwidth and frequency resolution, and within reasonable measurement times. Probing the GIRF must generally involve observing a system's response to given gradient input waveforms.

For this purpose, it has been proposed to record the field evolution with a dynamic field camera, i.e. with an array of miniature NMR probes that are operated simultaneously and positioned such as to distinguish different spatial components of interest. In the work done so far, particular emphasis was placed on designing specific gradient input waveforms that are tailored to the subsequent observation with a dynamic field camera (see Vannesjö S J et al., Field camera measurements of gradient and shim impulse responses using frequency sweeps. Magn Reson Med 2014; 72: 570-583, and references cited therein).

However, changes of the gradient impulse response due to various influencing factors such as e.g. thermal changes of components of the gradient system can limit the accuracy and hence applicability of the above proposed method.

Accordingly, it would be desirable to acquire GIRFs in a manner as simple as possible and without the need of interrupting ordinary MR data acquisition.

SUMMARY OF THE INVENTION

It is thus an object of the present invention to provide an improved, flexible and widely applicable method of determining an actual gradient impulse response function during execution of a magnetic resonance (MR) imaging or spectroscopy sequence within an ordinary MR imaging or MR spectroscopy set-up. A further, concurrent object of the present invention is to overcome the limitations and disadvantages of currently known methods and arrangements for magnetic resonance (MR) imaging or spectroscopy.

According to one aspect of the invention, a method of determining an actual gradient impulse response function during execution of a magnetic resonance (MR) imaging or spectroscopy sequence, wherein a main magnetic field is generated in a sample region of an MR apparatus by means of a main magnet and wherein superimposed time dependent gradient fields and radiofrequency fields in a first RF band are generated in the sample region according to a first MR sequence for forming images or spectra, the gradient fields being generated by gradient forming means of the MR apparatus operated according to a gradient forming sequence part of said first MR sequence, the MR apparatus further comprising at least one magnetic field probe, each one of said magnetic field probes being located at a pre-determined position and comprising a magnetic resonance (MR) active substance, means for pulsed MR excitation of said substance and means for receiving a probe MR signal generated by said substance, wherein said pulsed MR excitation and said probe MR signal is in a second RF band that does not overlap said first RF band, comprises the steps of:

operating said at least one magnetic field probe according to a second sequence, whereby a time dependent probe signal is repeatedly acquired from each magnetic field probe during a probe acquisition time window, thus providing at least one time dependent probe signals;

obtaining said actual gradient impulse response function by calculating an impulse response function from said at least one time dependent probe signal and from said gradient forming sequence part.

The above defined method may be understood as "gradient response harvesting". It is a method where the gradient responses are continuously characterized during an "ordinary" MRI or MR spectroscopy sequence. It employs MR field probes, preferably NMR field probes, which are placed in the scanner bore. The probes data is recorded repeatedly during the MR sequence. From the known input to the gradient amplifiers together with the field responses of the probes, a gradient response can be characterized. Information of several readouts can be combined to characterize the gradient system to the desired level of detail. The method does not require the field responses to be captured in a continuous or regular fashion, but allows for gaps between the measurements to wait for T2 decay and T1 recovery, and to ignore data if the field probes are dephased. The time to characterize the gradient system has to be short as compared to the time in which the gradient system changes its behavior to a desired level of detail.

In the following, the term "gradient impulse response function" will be abbreviated as GIRF.

In general, certain frequency components are not present in the MR sequence input, which is selected according to the task for which the MR apparatus is being used. These missing components evidently cannot be exploited for the construction of the actual GIRF. In other words, the actual GIRF obtained by exploiting a given MR sequence will have gaps in the neighborhood of the missing frequency components. However, on the one hand, these components are not required when utilizing the actual GIRF in any applications that are based on the same MR sequence as used for determining the actual GIRF. On the other hand, there are many situations in which the missing parts of the actual GIRF can be extrapolated or interpolated or estimated by applying prior knowledge of various types, thereby effectively completing the actual GIRF to a desired extent.

The obtained continuous gradient characterization according to this invention can be used to update the system calibration if deviations from a desired response are diagnosed. Alternatively the information may be used during the image reconstruction stage. Moreover the information might be used for quality assurance reasons (detection of broken gradient modules; characterization of long-term performance of hardware components).

Its implementation can vary in several aspects:
Different types of field probes can be employed, which can be optimized in terms of
  T2
  Nuclei
  Droplet size
  Number of probes
The gradient model can be restricted to better condition the gradient response calculation. Possible parameters are
  Frequency range
  Time constants off eddy-current related field terms
  Time constants of oscillatory terms
  Higher-order field terms
  Gradient cross-terms
Shim responses may also be measured
MR Sequence design
  may be unchanged
  Additional gradient waveforms, such as gradient blips may be inserted
Time of field measurements can be adjusted to capture the parts of the MR sequence which are likely to hold the desired information content to calculate the gradient response. This may include a step where the sequence is parsed before execution and the field measurements are placed in optimized positions
Data could be weighted by the probes signal level and could be discarded if the probes are dephased too much
Probes may be placed near to the patient or may be farer away (e.g. in the scanner bridge)
Update of the gradient response may be conducted in different ways. If a guaranteed time for a gradient response calculation can be asserted, common controllers such as PID controllers may be employed. Alternatively gradient response update can be delayed until sufficient information has been gathered. Another alternative could be to only selectively update features of the gradient response (e.g. specific eddy current time constants) which might be interesting for some applications and response models.

An initial guess of the gradient response function could be e.g. a gradient response that was measured in a calibration sequence, or the response function evaluated in the last sequence.

Real-time gradient response calculation and subsequent gradient pre-emphasis update could be combined with real-time field feed feedback. In this scenario real-time gradient pre-emphasis update could cover the short term field perturbations whereas slow field perturbations (<10 Hz or <100 Hz) could be covered by the field feedback.

A very limited implementation could also be to replace EPI phase correction.

According to another aspect of the invention, a method of operating an MR imaging or spectroscopy apparatus, comprises the step of determining an actual GIRF according to the present invention, wherein said actual GIRF is used to update a system calibration of said apparatus.

According to a further aspect of the invention, a method of operating an MR imaging or spectroscopy apparatus, comprises the step of determining an actual GIRF according to the present invention, wherein said actual GIRF is used for reconstruction of images or spectra obtained with said first MR sequence.

Advantageous embodiments are defined in the description below.

According to one embodiment, said gradient forming sequence part is substantially periodic with a first repetition time $t_{R1}$ and a minimum time gap $t_G$ between successive probe acquisition time windows is substantially larger than the sampling time required to cover the full bandwidth of the gradient forming sequence, with the provision that if said second sequence is substantially periodic with a second repetition time $t_{R2}$ then said repetition times $t_{R1}$ and $t_{R2}$ shall be incommensurable. In other words, the larger one of fractions $t_{R1}/t_{R2}$ and $t_{R2}/t_{R1}$ shall not be a rational number. This condition is imposed in order to avoid exclusive sampling of merely a few regions of the gradient forming sequence part due to a frequency beating effect.

According to another embodiment, the time gap between successive probe acquisition time windows is equal to or smaller than the sampling time required to cover the bandwidth of the gradient forming sequence. For this embodiment the gradient forming sequence part does not need to be substantially periodic.

According to another embodiment, said first RF band is selected for MR of $^1$H nuclei and said second RF band is selected for MR of $^{19}$F nuclei. For example, when using a main magnetic field of 3 T, the MR of $^1$H nuclei is at ~127.8 MHz whereas the MR of $^{19}$F nuclei is at ~120.2 MHz.

According to another embodiment, the MR apparatus comprises a plurality of at least four, preferably at least 16 magnetic field probes. It will be understood that the magnetic field probes shall be appropriately positioned, generally displaced from the isocenter. For example, they are evenly distributed on a sphere around the isocenter.

Other convenient arrangements of the field probes are possible. For example, they may be rigidly mounted into a part of an MR apparatus, e.g. in a patient bed structure.

A typical MR system has gradient ('x', 'y', 'z') amplifiers (and can have additionally multiple shim amplifiers) each having a separate input. For each gradient input channel, the response to any input gradient waveform can be calculated.

One way this can be done is by solving the following linear problem $$o = I \cdot c.$$

Here o denotes a vector of length M holding output field coefficient values for all measured time points. I is a matrix of size M×N where each line holds the input gradient waveform that is time-shifted correspondingly to o. Further, c denotes a vector of size N representing a discretized version of the unknown actual GIRF.

Another, very useful way to calculate the actual GIRF is based on fitting a physically motivated model, e.g. by fitting time constants of exponential decays and oscillatory terms. Optionally, further information, e.g. from temperature measurements, can be used for improvement of conditioning or precalibration of the gradient system and for its variation. Moreover field changes not relating to the gradient forming sequence, e.g. temperature related field drifts or field changes relating to patient physiology, may be modeled and used for the calculation of the actual GIRF.

Based on such physically motivated prior knowledge, the linear system may be constrained or regularized, which leads to an important computational simplification.

BRIEF DESCRIPTION OF THE DRAWINGS

The above mentioned and other features and objects of this invention and the manner of achieving them will become more apparent and this invention itself will be better understood by reference to the following description of embodiments of this invention taken in conjunction with the accompanying drawings, wherein

FIG. 5b is a zoomed section of the region labelled "B" in the graph of FIG. 5a;

FIG. 5c is a zoomed section of the region labelled "C" in the graph of FIG. 5a;

FIG. 5d is a zoomed section of the region labelled "D" in the graph of FIG. 5a;

DETAILED DESCRIPTION OF THE PREFERRED EMBODIMENTS OF THE INVENTION

Figure 1A:
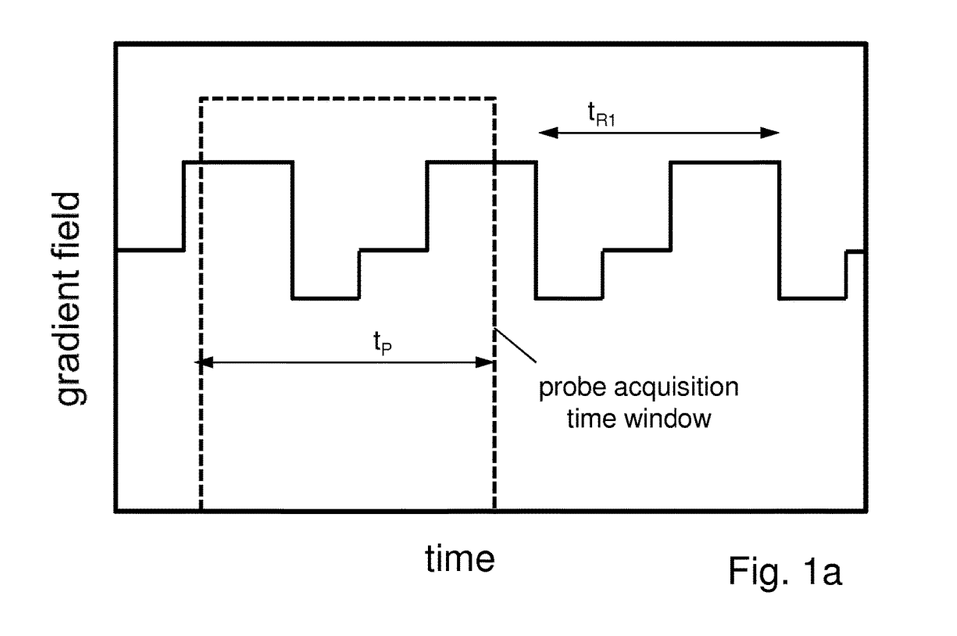
FIG. 1a shows an exemplary gradient forming sequence (continuous line) and probe acquisition window (dashed line) with comparatively long duration.

In the schematic drawing of FIG. 1a, a substantially periodic input gradient field with a first repetition time $t_{R1}$ and a probe acquisition time window with a width $t_P$ is shown.

Figure 1B:
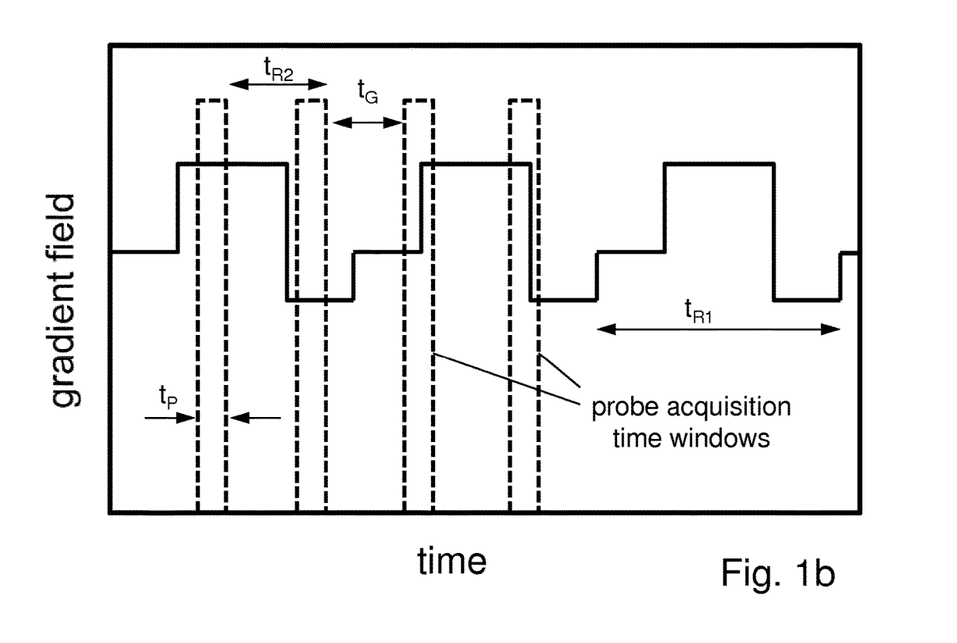
FIG. 1b shows the gradient forming sequence of FIG. 1a (continuous line) and a plurality of probe acquisition windows (dashed line) with comparatively short duration.

In the schematic drawing of FIG. 1b, a substantially periodic input gradient field with a first repetition time $t_{R1}$ and a sequence of probe acquisition time windows with a width $t_P$ is shown. In this example the acquisition time windows are substantially periodic with a repetition time $t_{R2}$ which means that the time gaps $t_G$ between successive time windows are constant. In the case of non-periodic sequences, the time gaps between different pairs of successive windows are variable.

EXAMPLE 1

An MR imaging sequence was played out at an MR system. Concurrent measurements of magnetic field responses were performed with an array of 16 NMR field probes. The actual observable of each probe is the phase of its NMR signal, which is proportional to the integral of the magnetic field magnitude at the probe position. Based on knowledge of the probe positions, the spatiotemporal field evolution is then expressed in terms of the previously chosen spatial basis functions Barmet C et al., Magn Reson Med 2008; 60: 187-197 2008. The resulting time-varying coefficients $k_m(t)$, which relate to spatial basis functions that are counted by m, indicate the observed phase accumulated due to fields of the respective spatial structure. The time-derivative of the phase coefficients gives corresponding field coefficients $$g_m(t) = \frac{1}{\gamma} \frac{dk_m(t)}{dt},$$

where γ is the gyromagnetic ratio of the NMR-active nucleus in the probes.

In the present experiments the sequence repetition time was 6.3 ms. The NMR field probe data was acquired simultaneously with 16 NMR field probes (T1=approx. T2=approx. 110 us).

In order to retrieve field information from the NMR probes, each probe is excited by an RF pulse. Subsequently, the NMR signal that holds the field information can be acquired on a high bandwidth.

In this experiment, a sampling time of 1 us was used.

Due to $T_2$ decay of the NMR probes, the NMR signal provides field information only for a limited time. After that, the probes need to be excited again. Before re-exciting the field probes, it is necessary to wait for T1 recovery and T2 relaxation of the field probes.

In this experiment, an acquisition duration of 120 us was used with a probe repetition time of 210 us.

From all acquired field probe data and the known field probe positions, field coefficients were calculated by performing a spatial expansion on chosen basis functions using the field monitoring methodology described in Barmet C et al., Magn Reson Med 2008; 60: 187-197 2008 and in Vannesjö, loc. cit. 2013.

In this experiment, a spherical harmonic basis was chosen. Hence, the $0^{th}$ order field coefficients relating to the basis '1' describe global field changes; the field coefficients relating to the basis functions 'x', 'y' and 'z' are the fields gradient. Moreover, higher-order field coefficients can be calculated.

As mentioned further above, the response functions to any measured field coefficients can be calculated by solving the following linear problem $$o = I \cdot c$$

where o denotes a vector of length M holding output field coefficient values for all measured time points. I is a matrix of size M×N where each line holds the input gradient waveform that are time-shifted correspondingly to o whereas c denotes a vector of size N representing a discretized version of the unknown actual GIRF.

For this experiment, the response function of input gradient 'x' to measured output field gradient 'x' (self-term) was calculated. The field coefficients of the MR sequence were observed over a duration of 631.2 ms. In this time output data with a total duration of 361.2 ms was acquired. The length of response function was set to 20 ms. The response function c was calculated on a bandwidth of +−50 kHz (10 µs sample dwell), such that M=36120 and N=2000.

Figure 2A:
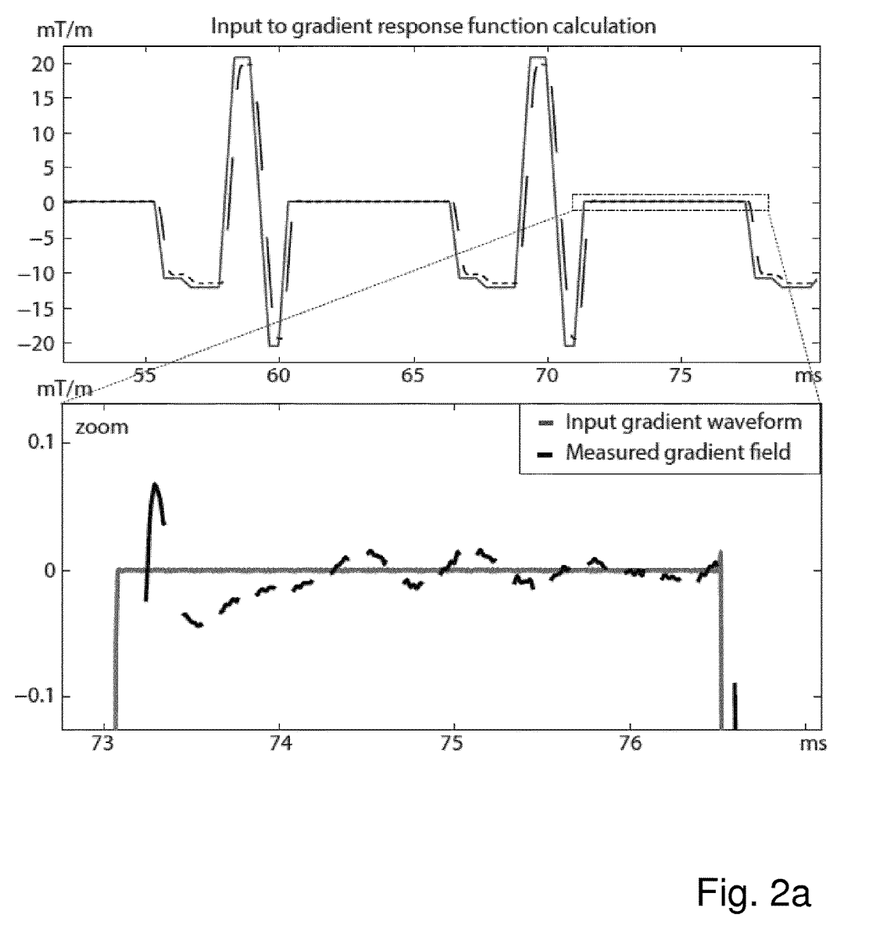
FIG. 2a shows a known gradient input function (continuous dark grey line) and measured portions of the gradient field (non-continuous black line), both expressed in mT/m as a function of time in ms.
Figure 2B:
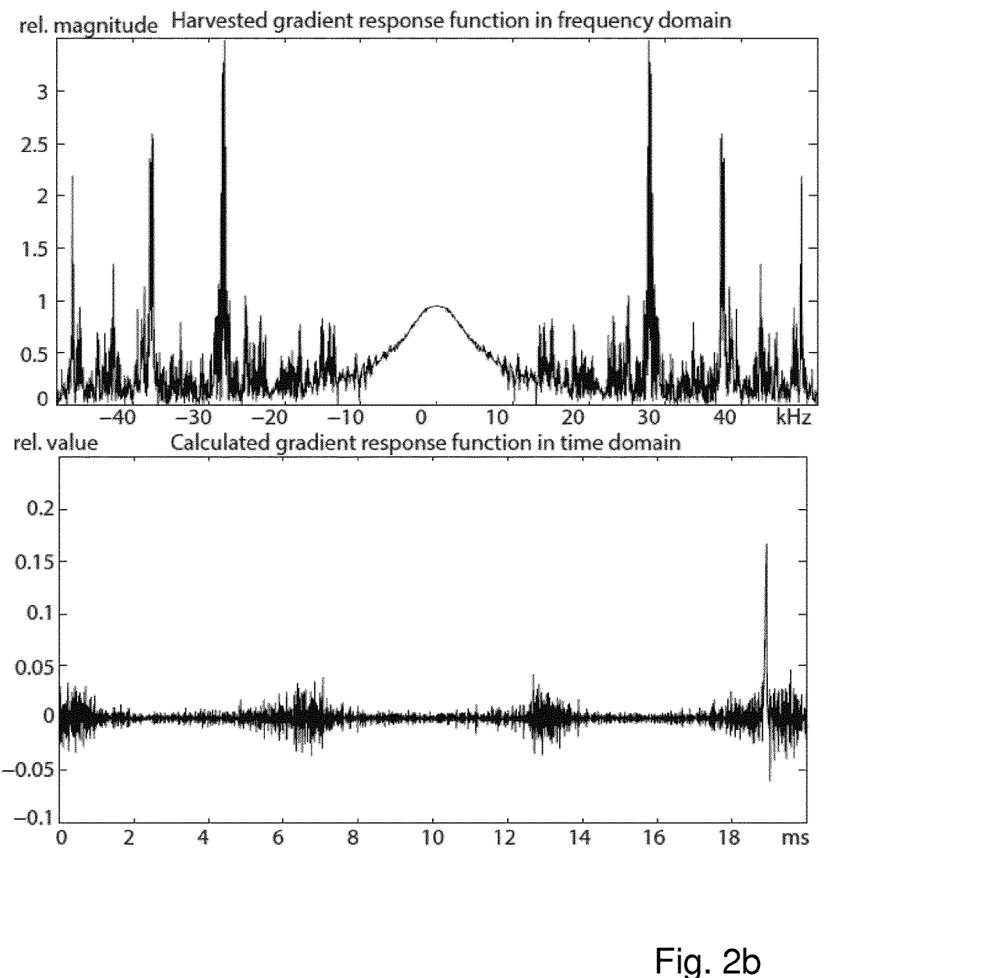
FIG. 2b shows the magnitude (in arbitrary units) of calculated actual GIRF in the frequency (Fourier) domain (upper panel, as a function of frequency in kHz) and in the time domain (lower panel, as a function of time in ms)
Figure 2C:
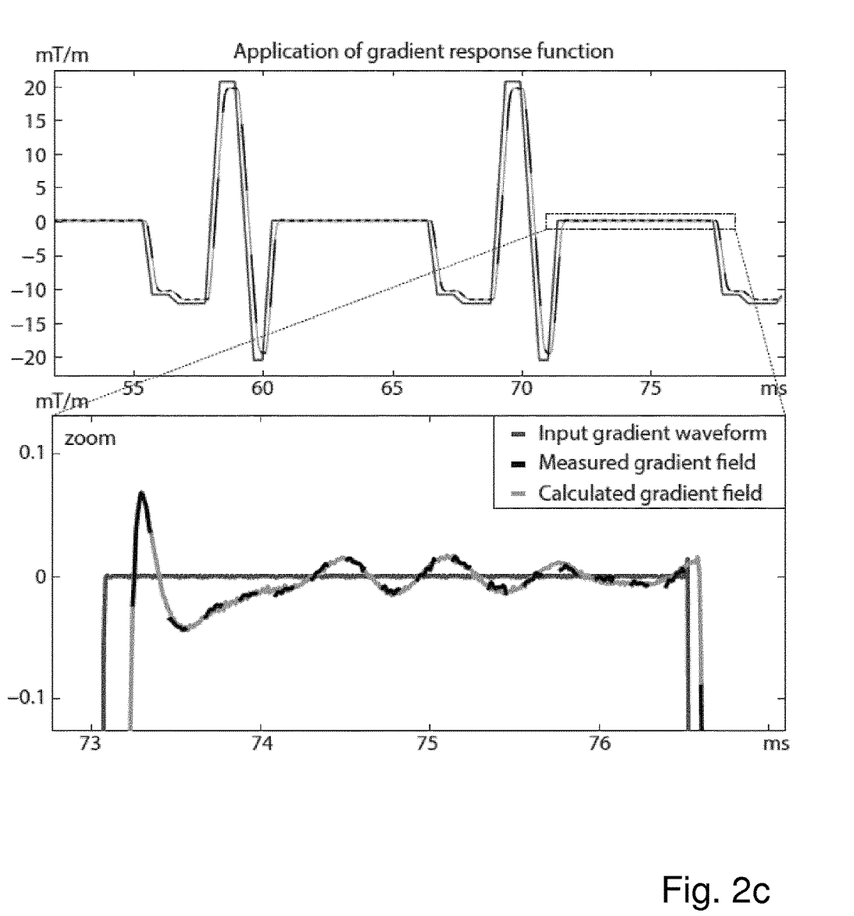
FIG. 2c shows, together with the known gradient input function (continuous dark grey line) and the measured portions of the gradient field (non-continuous black line) of FIG. 2a, the calculated gradient field (continuous light grey line), all expressed in mT/m as a function of time in ms.

The input and output gradients are plotted in FIG. 2a. The calculated response function is plotted in FIG. 2b. Since the gradient input did not comprise all frequencies, the gradient response is not deterministically calculated for these frequency components in this example. The response function can be used to calculate the field gradients where they were not measured, as demonstrated in FIG. 2c.

EXAMPLE 2

Figure 3:
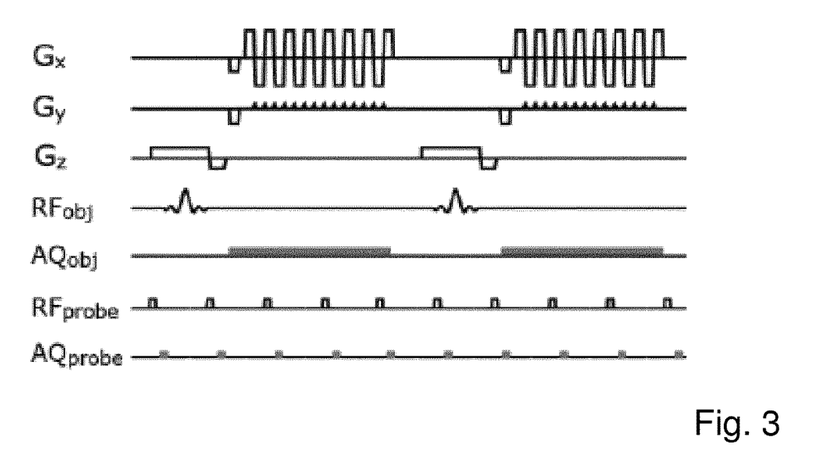
FIG. 3 is a representation of the applied sequence scheme according to which field probe data is acquired repeatedly during the entire MR sequence.

The experiments were conducted on a 3T-Achieva MR system (Philips Healthcare, Netherlands). Eight 19F-based field probes (T2=~2 ms) were mounted to a head receive coil array. For probe excitation and probe/coil data acquisition a dedicated RF-pulse generator and spectrometer were used. The position of the probes were obtained in an initial calibration step (Barmet C et al., loc. cit. 2008). Thereafter, a 2D-SSh-EPI (resolution=(1.3 mm)2, TE=61 ms, TR=150 ms, 20 slices) with 128 dynamics (duration=6:27 min) was performed. During the MR sequence, the probes were repeatedly excited (TRprobe=6.005 ms) followed by a readout of 500 µs (FIG. 3). From the probes data the gradient output during each readout was calculated (Barmet C et al., loc. cit. 2008), filtered to a bandwidth of ±50 kHz and gridded to the same time resolution (6.4 µs) as the gradient input.

Figure 4:
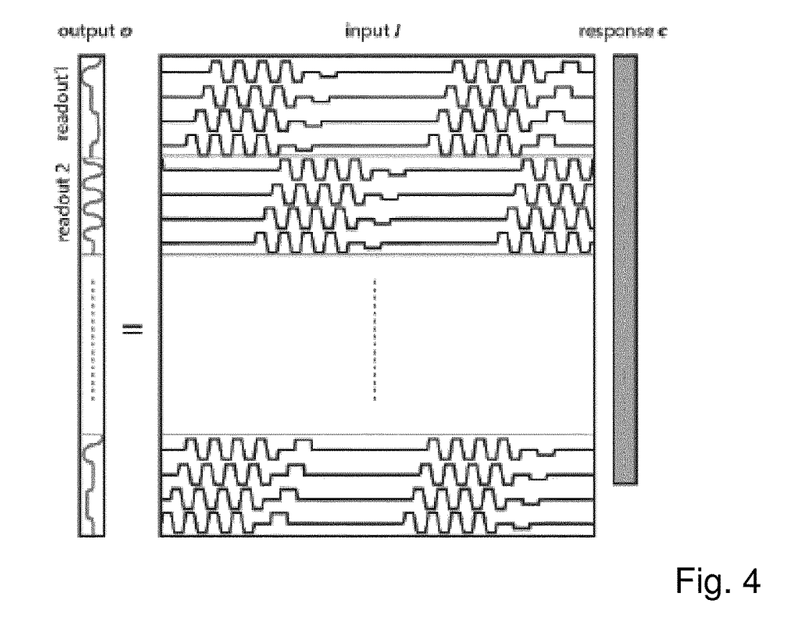
FIG. 4 is a schematic visualization of the linear system o=Ic that is used to calculate the unknown actual GIRF c (M×1); the vector o (N×1) holds the measured gradient samples; each row of I (N×M) holds a timeframe of the input gradients, each row being shifted by the time relating to the corresponding sample in o.
Figure 5A:
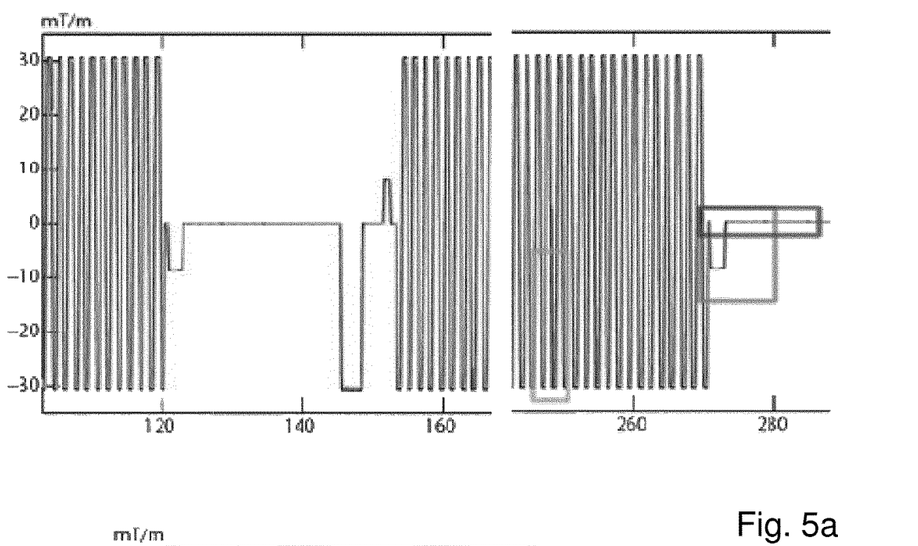
FIG. 5a is an excerpt of the given gradient input $i_{cont}$ (black) for the EPI read gradient axis, the obtained continuous gradient output $o_{cont}$ (blue) and the measured gradients o (red)
Figure 5B:
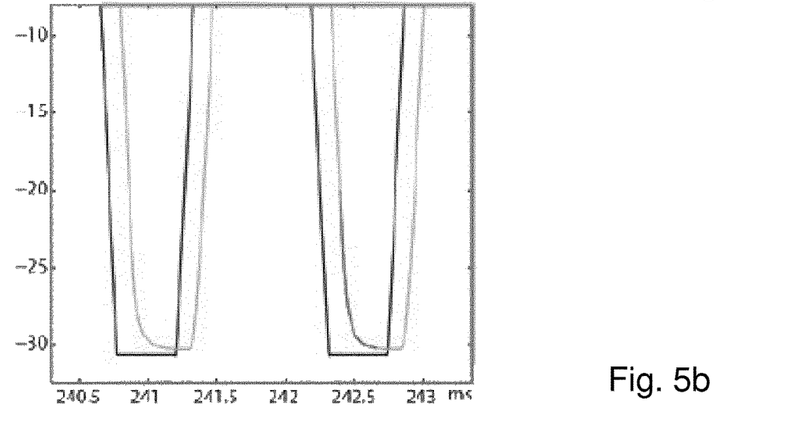
Figure 5C:
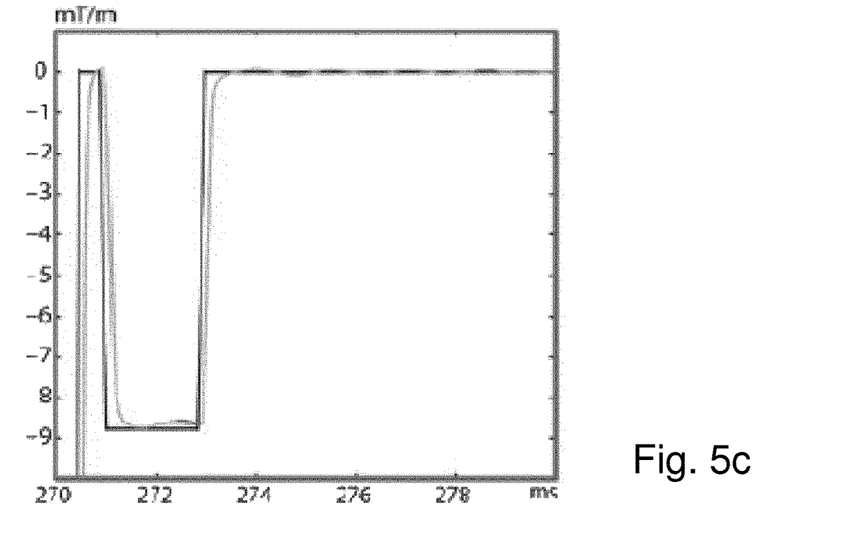
Figure 5D:
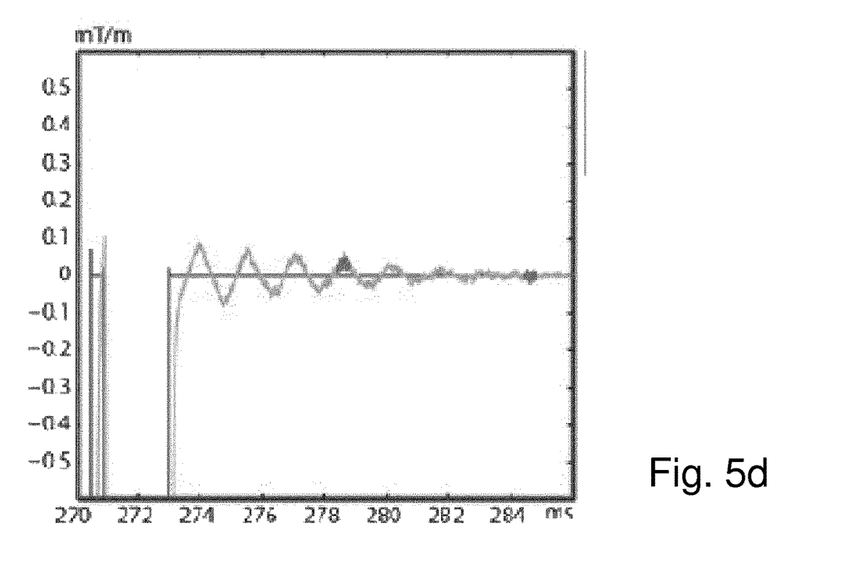

The gradient response c was subsequently calculated as detailed above and as illustrated in FIG. 4. For each gradient response calculation, 1300 output readouts were used (N=~50000, total harvesting time of 7.8 s). The length of the gradient response function was chosen to be 40 ms (M=6025).

Finally, the continuous gradient output $o_{cont}$ was calculated by multiplying a continuous input matrix $I_{cont}$ with the obtained response:

$$o_{cont} = I_{cont} \cdot c$$

For demonstration, the gradient responses were evaluated for the first $c^{(first)}$ and last $c^{(last)}$ portion of the EPI sequence for the read gradient axis.

The method was repeated for a gradient echo sequence (TR=50 ms, TE=5 ms, resolution=(1.4 mm)$^2$). Gridding based image reconstruction was performed using the obtained k-space trajectory.

Figure 6A:
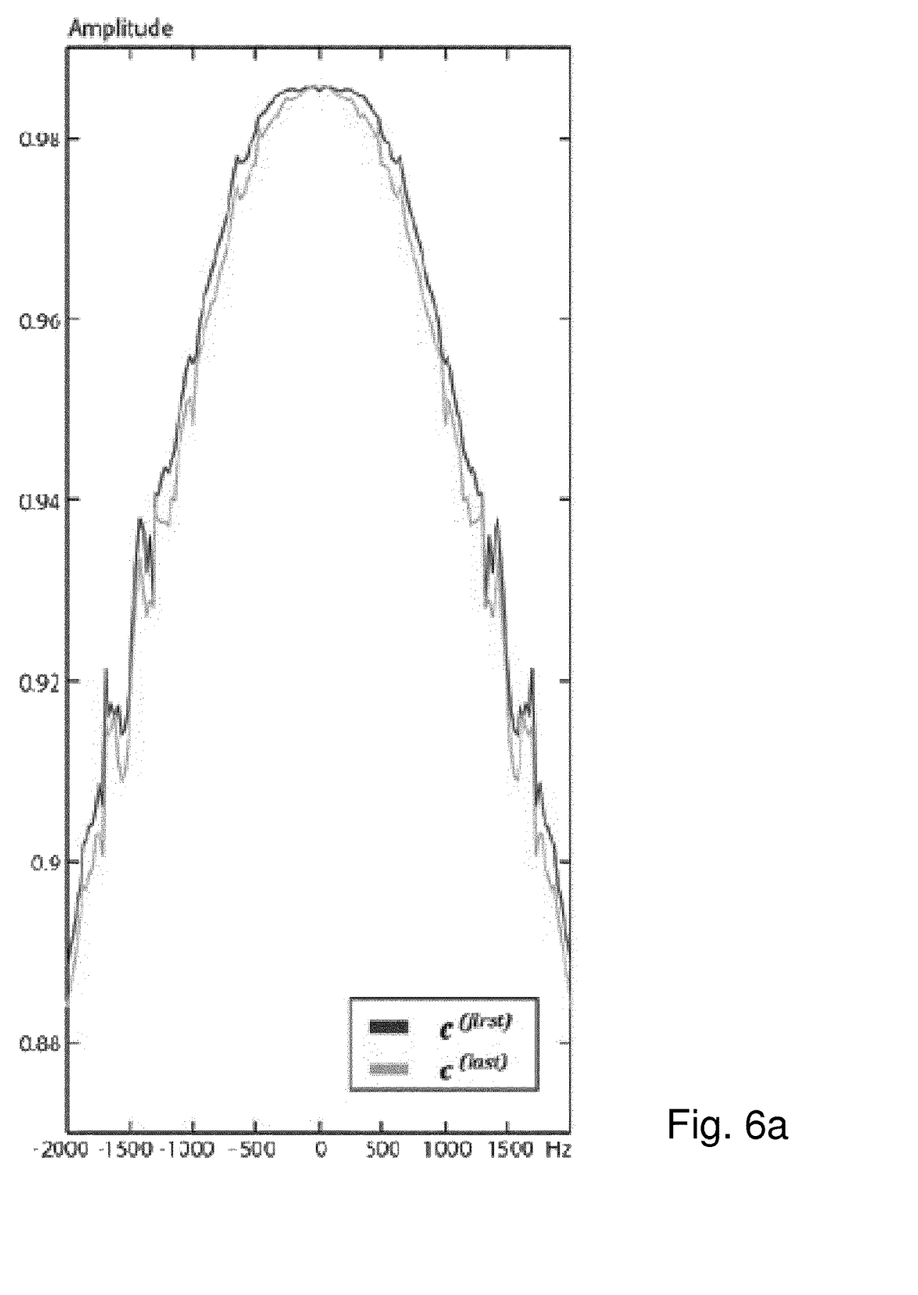
FIG. 6a is the gradient output obtained from the begin ($c^{(first)}$) and the end ($c^{(last)}$) of an EPI sequence (read gradient axis)
Figure 6B:
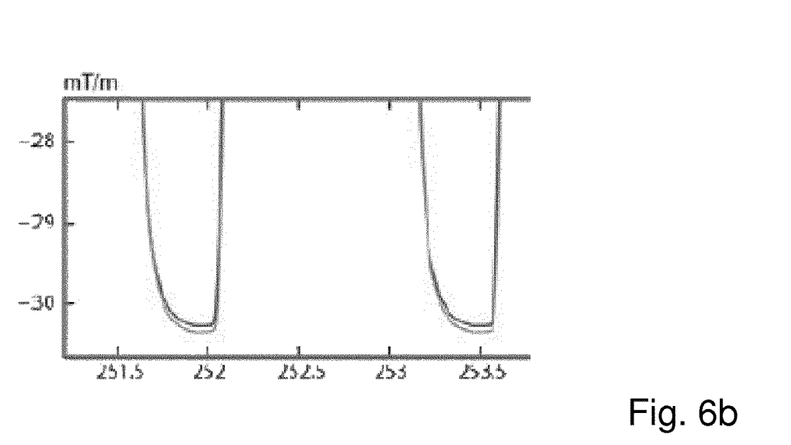
FIG. 6b is a first region of the obtained gradient output from the begin $o_{cont}^{(first)}$ and the end $o_{cont}^{(last)}$ of the EPI sequence.
Figure 6C:
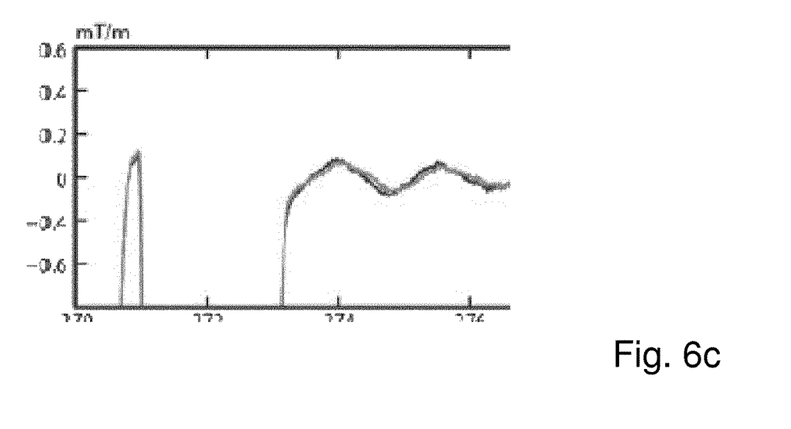
FIG. 6c is a first region of the obtained gradient output from the begin $o_{cont}^{(first)}$ and the end $o_{cont}^{(last)}$ of the EPI sequence.
Figure 7A:
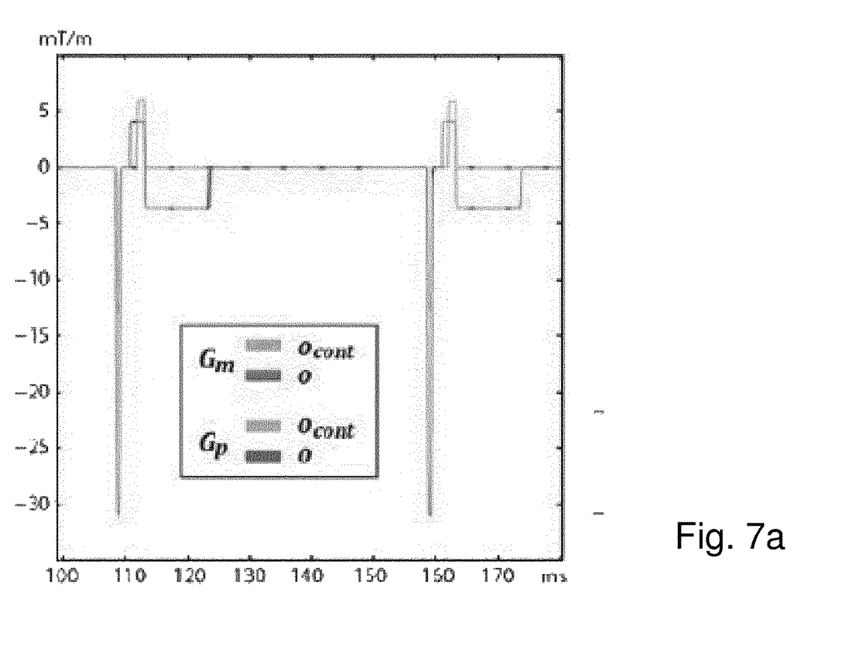
FIG. 7a is an excerpt of the continuously predicted gradient evolution $o_{cont}$ and measured gradients o for the read (Gm) and phase encoding (Gp) axis in a gradient echo imaging experiment.
Figure 7B:
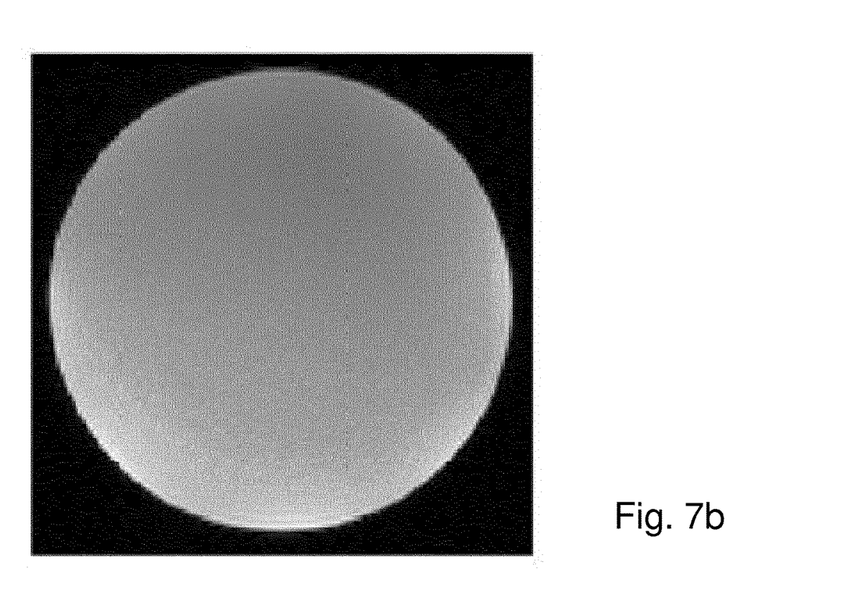
FIG. 7b is a gridding reconstruction of spherical phantom based on k-space trajectory calculated from $o_{cont}$.

The obtained continuous gradient output $o_{cont}$ matched the measured gradients o up to the noise level (FIG. 5a-d), indicating the validity of the linearity and time-invariance assumption during the total acquisition time of $o_{cont}$ showed effects from eddy currents and fine mechanical vibrations, demonstrating the sensitivity of the method. The response functions calculated from the beginning $c^{(first)}$ and the end $c^{(last)}$ of the EPI sequence, showed shifts of oscillatory terms as well as a global broadening in the frequency domain (FIG. 6a), which were also reflected in the gradient time courses $o_{cont}^{(first)}$ and $o_{cont}^{(last)}$ (FIG. 6b,c). The obtained k-space data for the gradient echo scan allowed for a faithful image reconstruction (FIG. 7).

The invention claimed is:

1. A method of determining an actual gradient impulse response function during execution of a magnetic resonance (MR) imaging or spectroscopy sequence, wherein a main magnetic field is generated in a sample region of an MR apparatus by means of a main magnet and wherein superimposed time dependent gradient fields and radiofrequency fields in a first RF band are generated in the sample region according to a first MR sequence for forming images or spectra, the gradient fields being generated by gradient forming means of the MR apparatus operated according to a gradient forming sequence part of said first MR sequence, the MR apparatus further comprising at least one magnetic field probe, each one of said magnetic field probes being located at a pre-determined position and comprising a magnetic resonance (MR) active substance, means for pulsed MR excitation of said substance and means for receiving a probe MR signal generated by said substance, wherein said pulsed MR excitation and said probe MR signal is in a second RF band that does not overlap said first RF band, the method comprising the steps of:

operating said at least one magnetic field probe according to a second sequence, whereby a time dependent probe signal is repeatedly acquired from each magnetic field probe during a probe acquisition time window, thus providing at least one time dependent probe signal;

obtaining said actual gradient impulse response function by calculating an impulse response function from said at least one time dependent probe signal and from said gradient forming sequence part.

2. The method according to claim 1, wherein said gradient forming sequence part is substantially periodic with a first repetition time $t_{R1}$ and a minimum time gap $t_G$ between successive probe acquisition time windows is substantially larger than the sampling time required to cover the full bandwidth of the gradient forming sequence, with the provision that if said second sequence is substantially periodic with a second repetition time $t_{R2}$ then said repetition times $t_{R1}$ and $t_{R2}$ shall be incommensurable.

3. The method according to claim 2, wherein said first RF band is selected for MR of $^1$H nuclei and wherein said second RF band is selected for MR of $^{19}$F nuclei.

4. The method according to claim 2, wherein the MR apparatus comprises a plurality of at least four magnetic field probes.

5. A method of operating an MR imaging or spectroscopy apparatus, comprising the step of determining an actual gradient impulse response function according to claim 2, wherein said actual gradient impulse response function is used to update a system calibration of said apparatus.

6. A method of operating an MR imaging or spectroscopy apparatus, comprising the step of determining an actual gradient impulse response function according to claim 2, wherein said actual gradient impulse response function is used for reconstruction of images or spectra obtained with said first MR sequence.

7. The method according to claim 1, wherein the time gap between successive probe acquisition time windows is equal to or smaller than the sampling time required to cover the bandwidth of the gradient forming sequence.

8. The method according to claim 7, wherein said first RF band is selected for MR of $^1$H nuclei and wherein said second RF band is selected for MR of $^{19}$F nuclei.

9. The method according to claim 7, wherein the MR apparatus comprises a plurality of at least four magnetic field probes.

10. A method of operating an MR imaging or spectroscopy apparatus, comprising the step of determining an actual gradient impulse response function according to claim 7, wherein said actual gradient impulse response function is used to update a system calibration of said apparatus.

11. A method of operating an MR imaging or spectroscopy apparatus, comprising the step of determining an actual gradient impulse response function according to claim 7, wherein said actual gradient impulse response function is used for reconstruction of images or spectra obtained with said first MR sequence.

12. The method according to 1, wherein said first RF band is selected for MR of $^1$H nuclei and wherein said second RF band is selected for MR of $^{19}$F nuclei.

13. The method according to claim 12, wherein the MR apparatus comprises a plurality of at least four magnetic field probes.

14. A method of operating an MR imaging or spectroscopy apparatus, comprising the step of determining an actual gradient impulse response function according to claim 12, wherein said actual gradient impulse response function is used to update a system calibration of said apparatus.

15. A method of operating an MR imaging or spectroscopy apparatus, comprising the step of determining an actual gradient impulse response function according to claim 12, wherein said actual gradient impulse response function is used for reconstruction of images or spectra obtained with said first MR sequence.

16. The method according to claim 1, wherein the MR apparatus comprises a plurality of at least four magnetic field probes.

17. A method of operating an MR imaging or spectroscopy apparatus, comprising the step of determining an actual gradient impulse response function according to claim 16, wherein said actual gradient impulse response function is used to update a system calibration of said apparatus.

18. A method of operating an MR imaging or spectroscopy apparatus, comprising the step of determining an actual gradient impulse response function according to claim 16, wherein said actual gradient impulse response function is used for reconstruction of images or spectra obtained with said first MR sequence.

19. A method of operating an MR imaging or spectroscopy apparatus, comprising the step of determining an actual gradient impulse response function according to claim 1, wherein said actual gradient impulse response function is used to update a system calibration of said apparatus.

20. A method of operating an MR imaging or spectroscopy apparatus, comprising the step of determining an actual gradient impulse response function according to claim 1, wherein said actual gradient impulse response function is used for reconstruction of images or spectra obtained with said first MR sequence.

* * * * *